US011769071B2

(12) United States Patent
Johri

(10) Patent No.: US 11,769,071 B2
(45) Date of Patent: Sep. 26, 2023

(54) SYSTEM AND METHOD FOR ERROR CORRECTION IN QUANTUM COMPUTING

(71) Applicant: IonQ, Inc., College Park, MD (US)

(72) Inventor: Sonika Johri, Portland, OR (US)

(73) Assignee: IONQ, INC., College Park, MD (US)

(*) Notice: Subject to any disclaimer, the term of this patent is extended or adjusted under 35 U.S.C. 154(b) by 109 days.

(21) Appl. No.: 17/536,957

(22) Filed: Nov. 29, 2021

(65) Prior Publication Data
US 2022/0172098 A1 Jun. 2, 2022

Related U.S. Application Data

(60) Provisional application No. 63/119,205, filed on Nov. 30, 2020.

(51) Int. Cl.
*H03M 13/00* (2006.01)
*G06N 10/70* (2022.01)
*H03M 13/13* (2006.01)

(52) U.S. Cl.
CPC ............ *G06N 10/70* (2022.01); *H03M 13/13* (2013.01)

(58) Field of Classification Search
CPC ....... G06N 10/20; G06N 10/70; H03M 13/13; H03M 13/37
See application file for complete search history.

(56) References Cited

U.S. PATENT DOCUMENTS

| 2012/0121012 A1* | 5/2012 | Shiodera | H04N 19/60 |
| | | | 375/240.03 |
| 2015/0046172 A1* | 2/2015 | Moriya | G10L 25/90 |
| | | | 704/500 |
| 2017/0228215 A1* | 8/2017 | Chatwin | G06F 7/5045 |
| 2019/0251213 A1* | 8/2019 | Bishop | G06F 30/20 |

* cited by examiner

Primary Examiner — Albert Decady
Assistant Examiner — Enamul M Kabir
(74) Attorney, Agent, or Firm — ARENTFOX SCHIFF LLP

(57) ABSTRACT

As system is provided for performing a method of receiving a superposition state defined by a sum of a plurality of addends, wherein each addend of the plurality of addends is a product between a corresponding coefficient of a plurality of coefficients and a corresponding state of a plurality of states encoded with block unary encoding. The system may identify at least one error state, of the plurality of states, having a string value that is not a block unary code string of a set of block unary code strings. The system may compute an updated superposition state based on the plurality of states without the error state.

18 Claims, 7 Drawing Sheets

| Decimal | $BU_q^{rs}$ | $BU_q^{rsy}$ | $BU_q^{rsyy}$ | $BU_q^{rsyyy}$ |
|---|---|---|---|---|
| 0 | 00 00 00 00 | 00 00 00 00 | 000 000 000 | 000 000 |
| 1 | 00 00 00 10 | 00 00 00 11 | 000 000 001 | 000 001 |
| 2 | 00 00 00 11 | 00 00 01 00 | 000 000 010 | 000 010 |
| 3 | 00 00 01 00 | 00 00 01 10 | 000 000 011 | 000 011 |
| 4 | 00 00 10 00 | 00 00 11 00 | 000 000 110 | 000 100 |
| 5 | 00 00 11 00 | 00 01 00 00 | 000 000 111 | 000 101 |
| 6 | 00 01 00 00 | 00 11 00 00 | 000 011 000 | 000 110 |
| 7 | 00 11 00 00 | 01 00 00 00 | 000 110 000 | 001 000 |
| 8 | 00 10 00 00 | 10 00 00 00 | 000 111 000 | 010 000 |
| 9 | 01 00 00 00 | 11 00 00 00 | 001 000 000 | 011 000 |
| 10 | 10 00 00 00 | | 010 000 000 | 110 000 |
| 11 | 11 00 00 00 | | 011 000 000 | 111 000 |

FIG. 3

SYSTEM AND METHOD FOR ERROR CORRECTION IN QUANTUM COMPUTING

CROSS-REFERENCE TO RELATED APPLICATIONS

The current application claims priority to, and the benefit of, U.S. Provisional Application No. 63/119,205, entitled "ERROR CORRECTION IN QUANTUM COMPUTING ALGORITHMS, filed on Nov. 30, 2020, the contents of which are hereby incorporated by reference in their entireties.

BACKGROUND OF THE DISCLOSURE

Aspects of the present disclosure generally relate to configurable quantum computing systems, and more specifically, to error corrections in quantum computing algorithms.

Quantum computers may provide computation capabilities exceeding that of classical, that is, non-quantum, computer systems. However, in a quantum computer (QC) for solid-state quantum bits or qubits (e.g., superconducting qubits, quantum dots (QDs), etc.), the qubits may encounter quantum decoherence during computations due to environmental factors (e.g., entangling with photons, thermal agitation, etc.). As such, information carried by the states of the qubits may be lost, which causes errors in the quantum algorithms using the qubits for computation. Therefore, error correction is desirable to reduce the errors in quantum computing.

SUMMARY OF THE DISCLOSURE

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its purpose is to present some concepts of one or more aspects in a simplified form as a prelude to the more detailed description that is presented later.

An aspect of the present disclosure includes a method for error correction including receiving a measurement of superposition state defined by a sum of a plurality of addends, wherein each addend of the plurality of addends is a product between a corresponding coefficient of a plurality of coefficients and a corresponding state of a plurality of states encoded with block unary encoding, identifying at least one error state, of the plurality of states, having a string value that is not a block unary code string of a set of block unary code strings, computing an updated measurement of superposition state based on the plurality of states without the error state, and providing the updated measurement to a quantum information processing (QIP) system to perform at least a portion of a quantum operation.

Certain aspects of the present disclosure includes a computer system having a memory including instructions and a processor configured to execute the instructions to receive a measurement of superposition state defined by a sum of a plurality of addends, wherein each addend of the plurality of addends is a product between a corresponding coefficient of a plurality of coefficients and a corresponding state of a plurality of states encoded with block unary encoding, identify at least one error state, of the plurality of states, having a string value that is not a block unary code string of a set of block unary code strings, compute an updated measurement of superposition state based on the plurality of states without the error state, and provide the updated measurement to a quantum information processing (QIP) system to perform at least a portion of a quantum operation.

Some aspects of the present disclosure includes a computer-readable medium storing code with instructions executable by a processor to receive a measurement of superposition state defined by a sum of a plurality of addends, wherein each addend of the plurality of addends is a product between a corresponding coefficient of a plurality of coefficients and a corresponding state of a plurality of states encoded with block unary encoding, identify at least one error state, of the plurality of states, having a string value that is not a block unary code string of a set of block unary code strings, compute an updated measurement of superposition state based on the plurality of states without the error state, and provide the updated measurement to a quantum information processing (QIP) system to perform at least a portion of a quantum operation.

BRIEF DESCRIPTION OF THE DRAWINGS

The appended drawings illustrate only some implementation and are therefore not to be considered limiting of scope.

FIG. 3 is a diagram that illustrates an example of a table including block unary code strings in accordance with aspects of this disclosure.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known components are shown in block diagram form in order to avoid obscuring such concepts.

This disclosure describes various aspects of an approach to implementing error correction in algorithms performed by a quantum computer (QC), QC system, or quantum information processing (QIP) system. The error correction may be performed in a classical computer system. The QC may be rely on Trapped ion technology, superconducting technology (e.g., transmons QC), topological technology, optical, or a combination thereof. Trapped ion technology may refer to the use of ions or atoms loaded and arranged into a trap or similar structure to control their states in order to perform quantum operations/simulations. As used herein, the terms quantum computer, quantum computer system, quantum computing system, an quantum information processing system may be used interchangeably.

Figure 1A:
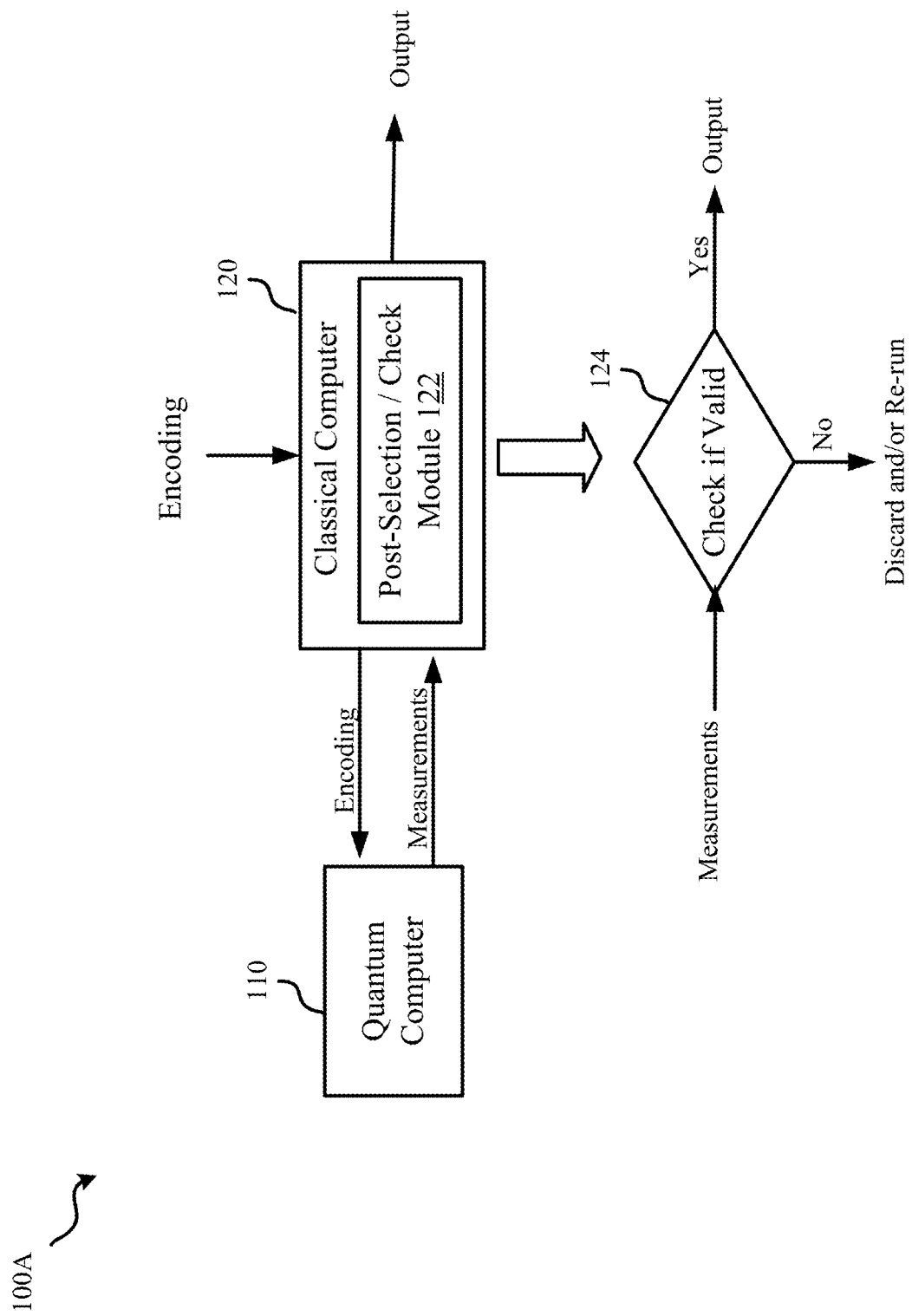
FIG. 1A is a diagram that illustrates an example of a system for performing error correction in accordance with aspects of this disclosure.

Referring now to FIG. 1A, a first example of a system 100A for performing error correction in quantum computing algorithms may include a quantum computer 110. The quantum computer 110, such as a trapped ion quantum computer, a superconducting quantum computer, or an optical quantum computer, may perform quantum algorithms. The quantum computer 110 may output measurements of the states of the qubits. The measurements may represent quantum states as determined by the quantum computer 110 as explained in further detail below.

In some implementations, the system 100A may include a classical computer 120. The classical computer 120 may be a standalone system separate from the quantum computer 110. The classical computer 120 may include a post-selection/check module 122 configured to determine whether any of the quantum states includes an encoding error. The classical computer 120 may receive an indication of the encoding, and/or transmit the indicated encoding to the quantum computer 110 before receiving the measurements.

In an aspect of the present is closure, the classical computer 120 may receive an indication of the encoding (e.g., unary encoding or block unary encoding) from an external device (not shown) during operation. The classical computer 120 may transmit the encoding to the quantum computer 110. The quantum computer 110 may perform one or more quantum algorithms based on the encoding indicated by the classical computer 120. The quantum computer 110 may generate, in response to performing the one or more quantum algorithms, computed quantum states based on the indicated encoding. The encoding may be applied to the input of the one or more quantum algorithms, or while the quantum computer 110 is executing the one or more quantum algorithms. After the quantum computer 110 transmits the results of the measurements to the classical computer 120, the post-selection/check module 122 may determine whether the quantum states include any encoding errors with respect to the indicated encoding scheme.

In one aspect of the present disclosure, the encoding may confine the valid (i.e., free of error) quantum states to code strings of a code. Quantum states that have string values that are not a code string of a code may be considered to include one or more errors that occurred during the performance of the quantum algorithms.

In certain implementations, at block 124, the post-selection/check module 122 may check if the quantum states are valid by identifying any quantum state having string values (as represented by the individual states of the qubits) that is not a code string of a unary code or a block unary code. If the post-selection/check module 122 identifies a quantum state having string values that is not a code string of the unary code or the block unary code, the post-selection/check module 122 may discard the quantum state when computing the probability distribution of the quantum state (also referred as the measurement of superposition state), and/or request the quantum computer 110 to re-run the quantum algorithm. If all the quantum states are valid, the post-selection/check module 122 may compute the probability distribution of the quantum state and transmit the probability distribution of the quantum state as an output.

In an example of the present disclosure, the classical computer 120 may receive an indication indicating the unary encoding scheme. The classical computer 120 may transmit the indication of the unary encoding scheme to the quantum computer 110. In response, the quantum computer 110 may perform one or more quantum algorithms based on the unary encoding scheme. After the completion of the one or more quantum algorithms, the quantum computer 110 may transmit measurements of the superposition quantum state represented by the following equation:

$$|\psi\rangle = v_1|1\,0\,0\,0\,\ldots\,\rangle + v_2|0\,1\,0\,0\,0\,\ldots\,\rangle + v_3|0\,0\,1\,0\,0\,0\,\ldots\,\rangle + \ldots$$

where $v=[v_1\ v_2\ \ldots\ v_n]$ is a classical vector having individual coefficients of $v_1, v_2, \ldots v_n$ and n is a positive integer. The quantum states may be encoded with the unary encoding having code strings of (1 0 0 . . . ), (0 1 0 0 0 . . . ), (0 0 1 0 0 0 . . . ) . . . . Each qubit value of the code strings may be associated with one or more qubits in the quantum computer 110. Specifically, each qubit value may represent a state of the one or more qubits after the quantum computer 110 performs the one or more quantum algorithms. In this example, each code string of the unary code may include only one "1" in the entire code strings. If the post-selection/check module 122 identifies a quantum state (or more) having string values that is not a code string of the unary code indicated by the encoding scheme (i.e., a code string have string values with more than one "1"), the post-selection/check module 122 may discard the quantum state when computing the probability distribution of the quantum state, and/or transmit a request to the quantum computer 110 to re-run the one or more quantum algorithms. If all the quantum states are valid, the post-selection/check module 122 may compute the probability distribution of the quantum state and transmit the probability distribution of the quantum state as an output.

In certain instances of the unary encoding scheme, the "1s" in the quantum states and/or code strings may be trivially replaced with "0s" and the "0s" may be replaced with "1s".

In some implementations, the accuracy of the implemented quantum algorithms may be increased by performing post-selection of the measurements at the end of the execution of the one or more quantum algorithms to discard those quantum states that result in more than one qubit measured in the "1" state.

In some implementations, the error correction method of the present disclosure mitigates the effect of noise that takes the algorithm out of the encoding subspace (e.g., spanned by the unary code strings or the block unary code strings). In one aspect, the error correction may be modeled by a depolarizing noise model. For example, in a quantum computer, such as the quantum computers 110 or the quantum computer system 110A, the diagonal elements of the density matrix before measurements are:

$$\rho = \sum_{i=0}^{n} c_i |i\rangle\langle i|.$$

In the presence of depolarizing noise, the output of the quantum computer includes the diagonal elements above and the identify matrix (representing noise). Consequently, the equation above becomes:

$$\rho_d = p \sum_{i=0}^{n} c_i |i\rangle\langle i| + \frac{1-p}{2^n} I_{2^n}.$$

Here, $I_2{}^n$ is the identity matrix of size $2^n$, p is the probability of measuring the correct state, and n is the number of two-qubit gates. In many quantum computing systems, one of the noisiest operation is the two-qubit gate. If the number of two-qubit gates is linear in the number of qubits, p may be determined by the equation $p=f^{na}$, where f (the fidelity) is the depolarizing noise that occurs in the two-qubit gate and a is a constant, the state after post-selection becomes:

$$\rho = \frac{\sum_{i=0}^{n}\left(c_i' + \frac{1-f^{na}}{2^n f^{na}}\right)}{1 + \frac{1-f^{na}}{2^n f^{na}} n} |i\rangle\langle i|.$$

If $f \gg \frac{1}{2}^{1/a}$, then the convergence to the ideal density matrix gets better as the system size increases.

Figure 1B:
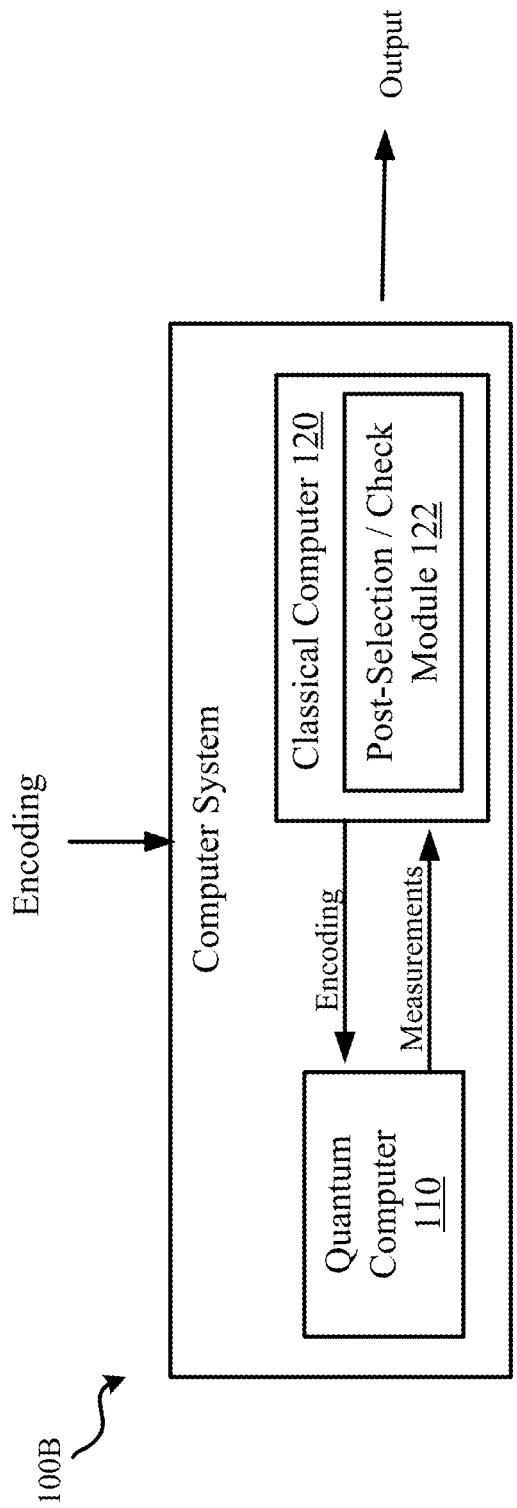
FIG. 1B is a diagram that illustrates an example of a computer system for performing error correction in accordance with aspects of this disclosure.

Referring now to FIG. 1B, a second example of a computer system 100B for performing error correction in quantum computing algorithms may be an integrated computer system having the quantum computer 110 and the classical computer 120. The quantum computer 110, such as a trapped ion quantum computer, a superconducting quantum computer, or an optical quantum computer, may perform quantum algorithms. The quantum computer 110 may output measurements of the states of the qubits. The measurements may represent quantum states as determined by the quantum computer 110 as explained above. The classical computer 120 may include the post-selection/check module 122 configured to determine whether any of the quantum states includes an encoding error. The computer system 100B and/or the classical computer 120 may receive an indication of the encoding, and/or transmit the indicated encoding to the quantum computer 110 before receiving the measurements.

In certain aspects of the present disclosure, the computer system 100B may receive an indication of the encoding (e.g., unary encoding or block unary encoding) from an external device (not shown) during operation. The computer system 100B may send the encoding to the quantum computer 110 and/or the classical computer 120. The quantum computer 110 may perform one or more quantum algorithms based on the encoding indicated by the classical computer 120. The quantum computer 110 may generate, in response to performing the one or more quantum algorithms, computed quantum states based on the indicated encoding. The encoding may be applied to the input of the one or more quantum algorithms, or while the quantum computer 110 is executing the one or more quantum algorithms. After the quantum computer 110 sends the results of the measurements to the classical computer 120, the post-selection/check module 122 may determine whether the quantum states include any encoding errors with respect to the indicated encoding scheme as described above with respect to the system 100A.

Figure 1C:
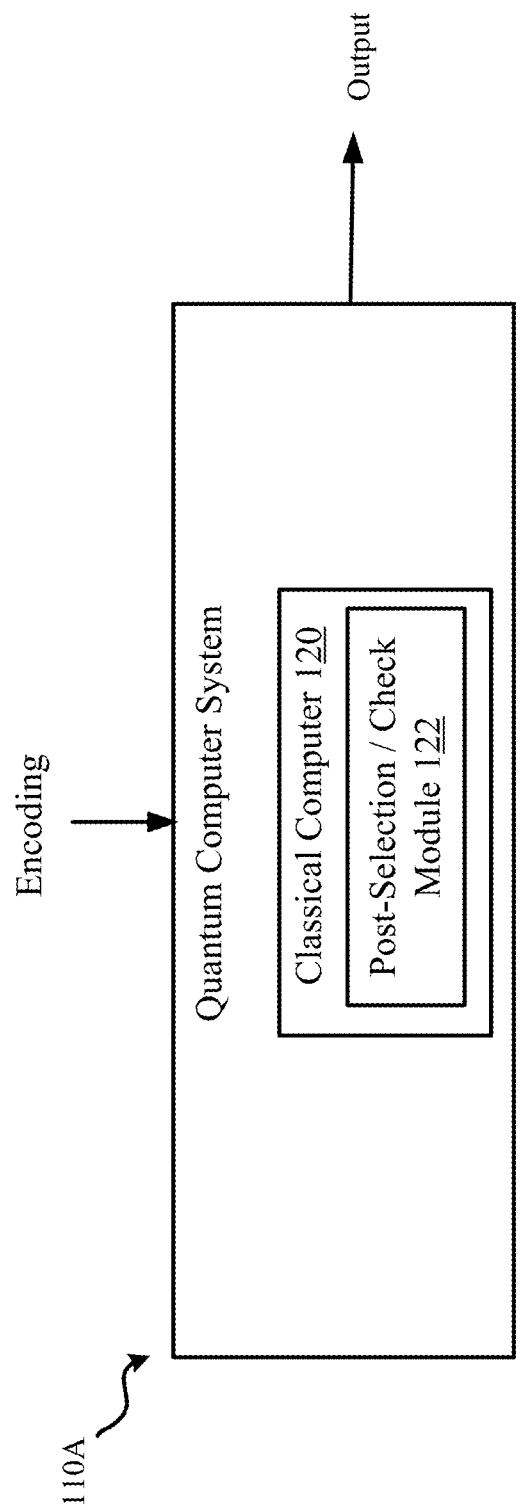
FIG. 1C is a diagram that illustrates an example of a quantum computer system for performing error correction in accordance with aspects of this disclosure.

Referring now to FIG. 1C, a third example of a quantum computer system 110A for performing error correction in quantum computing algorithms may include the classical computer 120. The quantum computer system 110A, such as a trapped ion quantum computer, a superconducting quantum computer, or an optical quantum computer, may perform quantum algorithms. The quantum computer system 110A may generate measurements of the states of the qubits. The measurements may represent quantum states as determined by the quantum computer system 110A as explained above. The classical computer 120 may include the post-selection/check module 122 configured to determine whether any of the quantum states includes an encoding error. The quantum computer system 110A may receive an indication of the encoding before receiving the measurements.

In certain aspects of the present is closure, the quantum computer system 110A may receive an indication of the encoding (e.g., unary encoding or block unary encoding) from an external device (not shown) during operation. The quantum computer system 110A may perform one or more quantum algorithms based on the encoding received. The quantum computer system 110A may generate, in response to performing the one or more quantum algorithms, computed quantum states based on the indicated encoding. The encoding may be applied to the input of the one or more quantum algorithms, or while the quantum computer system 110A is executing the one or more quantum algorithms. After the quantum computer system 110A sends the results of the measurements to the classical computer 120, the post-selection/check module 122 may determine whether the quantum states include any encoding errors with respect to the indicated encoding scheme as described above with respect to the system 100A.

Figure 2:
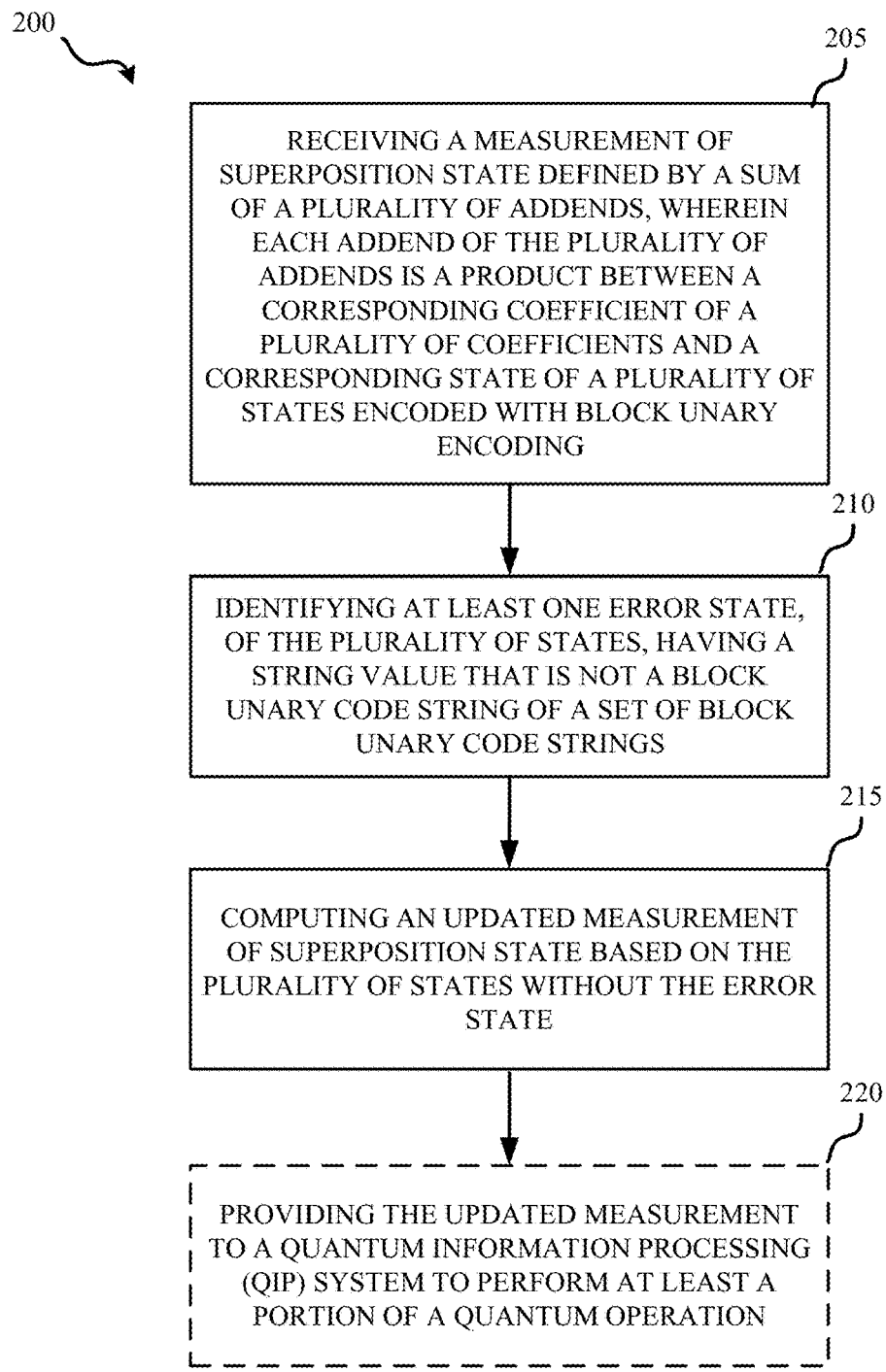
FIG. 2 is a diagram that illustrates an example of a method of error correction in accordance with aspects of this disclosure.
Figure 5:
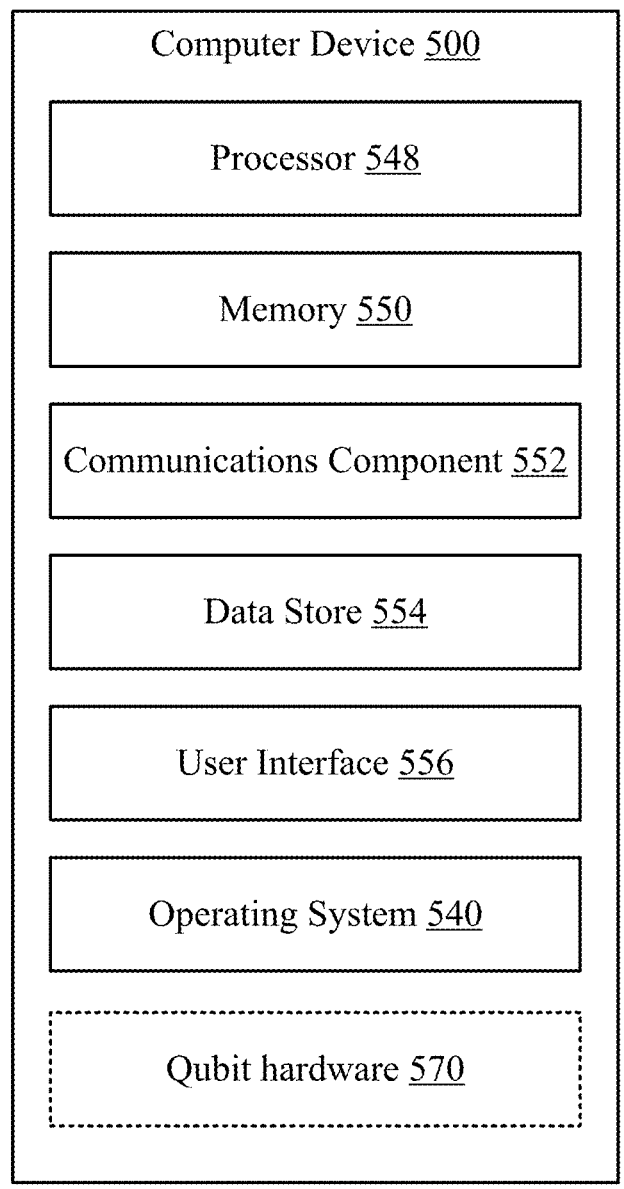
FIG. 5 is a diagram that illustrates an example of a computer device in accordance with aspects of this disclosure.

FIG. 2 shows a flow diagram illustrating an example of a method 200 for performing error correction according to aspects of the present disclosure. The method 200 may be performed by the classical computer 120, the post-selection/check module 122, the computer system 100B, the quantum computer system 110A, and/or the computer device 500 (FIG. 5).

At block 205, the method 200 may receive a measurement of superposition state defined by a sum of a plurality of addends, wherein each addend of the plurality of addends is a product between a corresponding coefficient of a plurality of coefficients and a corresponding state of a plurality of states encoded with block unary encoding. For example, the classical computer 120, the post-selection/check module 122, the computer system 100B, the computer device 500, and/or components of the computer device 500 may receive a measurement of superposition state (the probability distribution of the quantum state) defined by a sum of a plurality of addends, wherein each addend of the plurality of addends is a product between a corresponding coefficient of a plurality of coefficients and a corresponding state of a plurality of states encoded with block unary encoding. The classical computer 120, the post-selection/check module 122, the computer system 100B, the computer device 500, and/or components of the computer device 500 may be configured to and/or define means for receiving a measurement of superposition state defined by a sum of a plurality of addends, wherein each addend of the plurality of addends is a product between a corresponding coefficient of a plurality of coefficients and a corresponding state of a plurality of states encoded with block unary encoding.

At block 210 the method 200 may identify at least one error state, of the plurality of states, having a string value that is not a block unary code string of a set of block unary code strings. For example, the classical computer 120, the post-selection/check module 122, the computer system 100B, the computer device 500, and/or components of the computer device 500 may identify at least one error state, of the plurality of states, having a string value that is not a block unary code string of a set of block unary code strings. The classical computer 120, the post-selection/check module 122, the computer system 100B, the computer device 500, and/or components of the computer device 500 may be configured to and/or define means for identifying at least one error state, of the plurality of states, having a string value that is not a block unary code string of a set of block unary code strings.

At block 215 the method 200 may compute an updated measurement of superposition state based on the plurality of states without the error state. For example, the classical computer 120, the post-selection/check module 122, the computer system 100B, the computer device 500, and/or components of the computer device 500 may compute an updated measurement of superposition state based on the plurality of states without the error state. The classical computer 120, the post-selection/check module 122, the computer system 100B, the computer device 500, and/or components of the computer device 500 may be configured to and/or define means for computing an updated measurement of superposition state based on the plurality of states without the error state.

At block 220, the method 200 may optionally provide the updated measurement to a quantum information processing (QIP) system to perform at least a portion of a quantum operation. For example, the classical computer 120, the post-selection/check module 122, the computer system 100B, the computer device 500, and/or components of the computer device 500 may provide the updated measurement to a quantum information processing (QIP) system to perform at least a portion of a quantum operation. The QIP system receiving the updated measurement may be integrated with, or external to, the system that computes and/or outputs the update measurement. In some aspects, the classical computer 120, the post-selection/check module 122, the computer system 100B, the computer device 500, and/or components of the computer device 500 may be configured to and/or define means for providing the updated measurement to a quantum information processing (QIP) system to perform at least a portion of a quantum operation.

FIG. 3 illustrates an example of table 300 including code strings used for block unary encodings according to aspects of the present disclosure. In some aspects, the error correction method may be extended to block unary encodings where more than one decimal is used for encoding. In one example, g decimals may encoded with m qubits where m=⌈$\log_2$ (g)⌉, which shows the minimum number of bits required for the encoding. A vector with n elements is then encoded into k qubits where $$k = \left\lceil \frac{n}{g} \right\rceil.$$

Similar to the unary encoding, the post-selection process may include discarding the measurements that result in bit strings that are not in the encoding.

Figure 4:
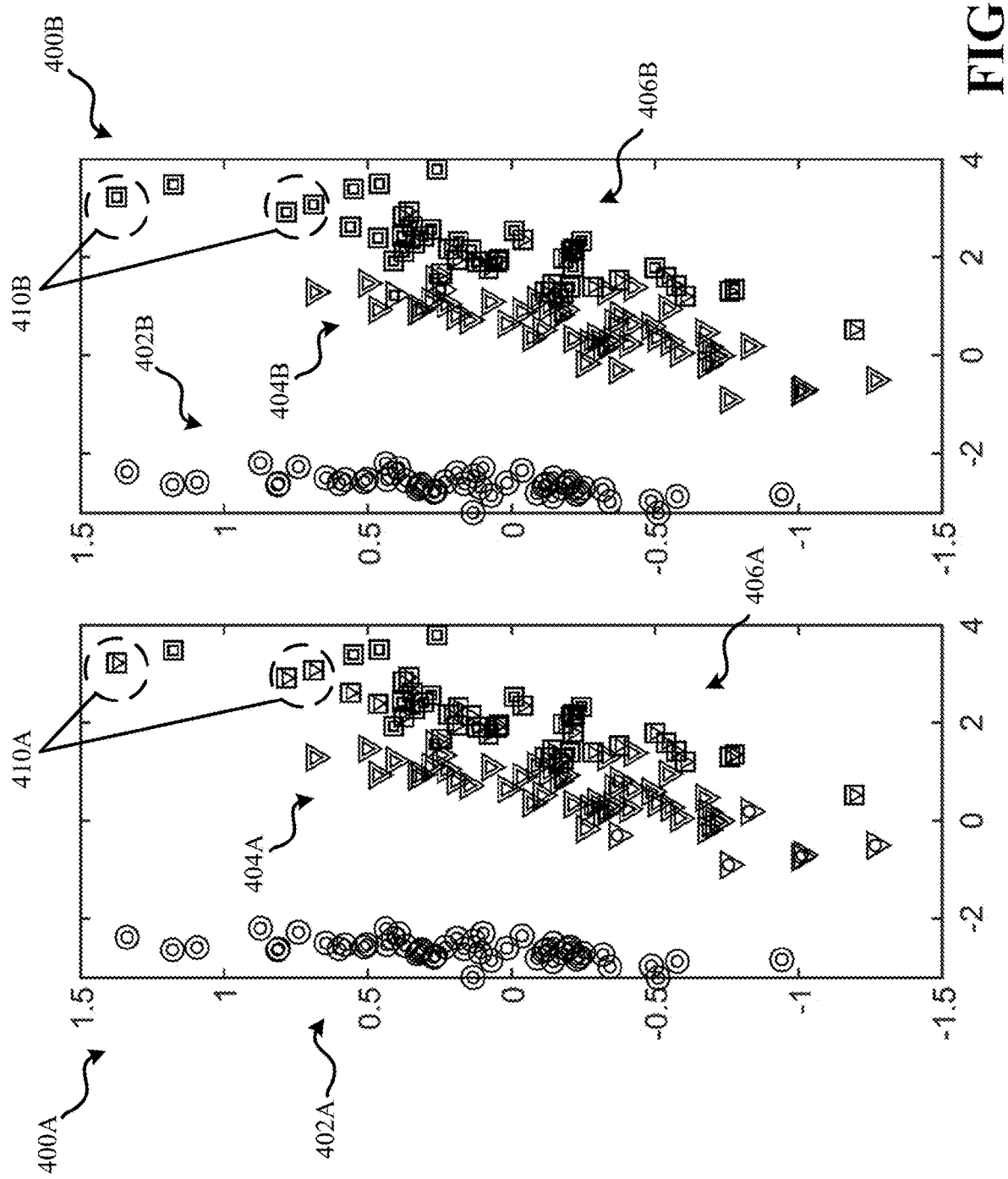
FIG. 4 is a diagram that illustrates an example of improvements of classification in accordance with aspects of this disclosure.

FIG. 4 illustrates an example of improvements of classification by a quantum computer implementing the error correction method of the present disclosure. The quantum computer may implement the quantum nearest centroid algorithm test on four qubits. A first graph 400A shows the classification without the error correction and a second graph 400B shows the classification with the error correction. The first set of dots 402A, 402B (◉; the shape of each dot is two concentric circles having a smaller circle inside a larger circle) represent a first group of classifications by a quantum computer (with and without error correction, respectively). The second set of dots 404A, 404B (▽ ; the shape of each dot is two concentric triangles having a smaller triangle inside a larger triangle) represent a second group of classifications by the quantum computer (with and without error correction, respectively). The third set of dots 406A, 406B (▣; the shape of each dot is two concentric squares having a smaller square inside a larger square) represent a third group of classifications by the quantum computer (with and without error correction, respectively). Misclassified markers 410A (▨; the shape of each dot is a smaller triangle inside a larger square) in the first graph 400A are shown as properly classified markers 410B (e.g., third set of dots 406 as shown) in the second graph. The reduction of classification error may be greater than 1%, 2%, 5%, 10%, 15%, 20%, or 25%.

Referring now to FIG. 5, illustrated is an example computer device 500 in accordance with aspects of the disclosure. The computer device 500 can represent a single computing device, multiple computing devices, or a distributed computing system, for example. The computer device 500 may be configured as a quantum computer (or QC/QIP system), a classical computer, or a combination of quantum and classical computing functions. For example, the computer device 500 may implement some or all of the features described herein for a quantum computer. Moreover, the computer device 500 may implement aspects of a classical computer to perform certain functions such as compiling, optimization, and the like. In addition, the computer device 500 may implement a combination of classical computer and quantum computer features sequentially and/or concurrently in order to enable the various aspects described herein. As such, the computer device 500 may include one or more of the hardware and/or software components described in connection with FIGS. 1A-1C.

For example, one or more of the system 100A, the computer system 100B, the quantum computer 110, the quantum computer system 110A, the classical computer 120, and/or the post-selection/check module 122 may be implemented by the computer device 500 and/or the components of the computer device 500.

More generally, the computer device 500 may include a processor 548 for carrying out processing functions associated with one or more of the features described herein. The processor 548 may include a single or multiple set of processors or multi-core processors. Moreover, the processor 548 may be implemented as an integrated processing system and/or a distributed processing system.

The processor 548 may include a central processing unit (CPU), a quantum processing unit (QPU), or both. As such, the processor 548 can be used to perform or implement classical operations, quantum operations, or a combination of classical operations and quantum operations.

The processor 548 may be used to, for example, implement at least a portion of control units, communication control units, and/or switch/router units, to run at least a portion of programs, APIs and/or QOS, and/or to implement aspects associated with qubit control.

The processor 548 may be used to, for example, perform the resource manager workflow C, implement the levels of application programming interface (API) access points, implement functions of the compiler architecture, and/or implement the exceptions.

The computer device 500 may include a memory 550 for storing data, which may include instructions executable by the processor 548 for carrying out the functions described herein. In an implementation, the memory 550 may correspond to a computer-readable storage medium that stores code or instructions to perform one or more of the functions or operations described herein.

Further, the computer device 500 may include a communications component 552 that provides for establishing and maintaining communications with one or more parties utilizing hardware, software, and services as described herein. The communications component 552 may carry communications between components on the computer device 500, as well as between the computer device 500 and external devices, such as devices located across a communications network and/or devices serially or locally connected to computer device 500. For example, the communications component 552 may include one or more buses, and may further include transmit chain components and receive chain components associated with a transmitter and receiver, respectively, operable for interfacing with external devices.

Additionally, the computer device 500 may include a data store 554, which can be any suitable combination of hardware and/or software, that provides for mass storage of information, databases, and programs employed in connection with implementations described herein. For example, the data store 554 may be a data repository for operating system 540 (e.g., classical OS, quantum OS, or both). In one implementation, the data store 554 may include the memory 550.

The computer device 500 may also include a user interface component 556 operable to receive inputs from a user of the computer device 500 and further operable to generate outputs for presentation to the user. The user interface component 556 may include one or more input devices, including but not limited to a keyboard, a number pad, a mouse, a touch-sensitive display, a digitizer, a navigation key, a function key, a microphone, a voice recognition component, any other mechanism capable of receiving an input from a user, or any combination thereof. Further, the user interface component 556 may include one or more output devices, including but not limited to a display, a speaker, a haptic feedback mechanism, a printer, any other mechanism capable of presenting an output to a user, or any combination thereof.

In an implementation, the user interface component 556 may transmit and/or receive messages corresponding to the operation of the operating system 540. In addition, the processor 548 may execute the operating system 540 and/or applications or programs, and the memory 550 or the data store 554 may store them.

When the computer device 500 is implemented as part of a cloud-based infrastructure solution, the user interface component 556 may be used to allow a user of the cloud-based infrastructure solution to remotely interact with the computer device 500. For example, the user may interact by providing an algorithm or simulation to be programmed for execution by the computer device 500.

In yet another aspect, the computer device 500, when implementing aspects of a quantum computer or QC/QIP system, may include qubit hardware 570. As mentioned above, the qubit hardware 570 may be based on one type of quantum technology, such as ion-trapped technology, in which case the qubit hardware 570 includes at least one ion trap to perform quantum operations. The qubit hardware 570 may be based on other types of quantum technology, such as superconducting technology and/or optical technology, in which case the qubit hardware 570 includes superconducting circuits to perform quantum operations.

Various aspects of the QC and QC/IP systems described in connection with this disclosure include aspects associated with the architecture, implementation, configuration, and optimization, including but not limited to architecture graph, circuit graph, portability, quadratic assignment problem, depth optimal layout, sequence of (heuristic) optimal embedding, single-instruction multiple-data (SIMD) QC, quantum circuit compilation, quantum circuit design, and quantum circuit optimization.

Aspects of the present disclosure includes a method for receiving a measurement of superposition state defined by a sum of a plurality of addends, wherein each addend of the plurality of addends is a product between a corresponding coefficient of a plurality of coefficients and a corresponding state of a plurality of states encoded with block unary encoding, identifying at least one error state, of the plurality of states, having a string value that is not a block unary code string of a set of block unary code strings, computing an updated measurement of superposition state based on the plurality of states without the at least one error state, and providing the updated measurement to a quantum information processing (QIP) system to perform at least a portion of a quantum operation.

Aspects of the present disclosure includes the method above, wherein each block unary code string of the set of block unary code strings includes only one 1 or one 0.

Aspects of the present disclosure includes the methods above, wherein identifying the at least one error state comprises identifying more than one 1 or more than one 0 in the string value.

Aspects of the present disclosure includes the method above, wherein each block unary code string of the set of block unary code strings includes a plurality bits each representing a quantum bit of a plurality quantum bits of the quantum computer.

Aspects of the present disclosure includes the method above, wherein the quantum computer is a trapped ion quantum computer.

Aspects of the present disclosure includes the method above, further comprising, in response to identifying the at least one error state, transmitting a request to the quantum computer to rerun the measurement.

Although the present disclosure has been provided in accordance with the implementations shown, one of ordinary skill in the art will readily recognize that there could be variations to the embodiments and those variations would be within the scope of the present disclosure. Accordingly, many modifications may be made by one of ordinary skill in the art without departing from the scope of the appended claims.

What is claimed is:

1. A method of error correction for a quantum computer, comprising:
   receiving a measurement of superposition state defined by a sum of a plurality of addends, wherein each addend of the plurality of addends is a product between a corresponding coefficient of a plurality of coefficients and a corresponding state of a plurality of states encoded with block unary encoding;
   identifying at least one error state, of the plurality of states, having a string value that is not a block unary code string of a set of block unary code strings;
   computing an updated measurement of superposition state based on the plurality of states without the at least one error state; and providing the updated measurement to a quantum information processing (QIP) system to perform at least a portion of a quantum operation.

2. The method of claim 1, wherein each block unary code string of the set of block unary code strings includes only one 1 or one 0.

3. The method of claim 2, wherein identifying the at least one error state comprises identifying more than one 1 or more than one 0 in the string value.

4. The method of claim 1, wherein each block unary code string of the set of block unary code strings includes a plurality bits each representing a quantum bit of a plurality quantum bits of the quantum computer.

5. The method of claim 1, wherein the quantum computer is a trapped ion quantum computer.

6. The method of claim 1, further comprising, in response to identifying the at least one error state, transmitting a request to the quantum computer to rerun the measurement.

7. A computer system, comprising:
a memory including instructions; and
a processor configured to execute the instructions to:
receive a measurement, output by a quantum computer, of superposition state defined by a sum of a plurality of addends, wherein each addend of the plurality of addends is a product between a corresponding coefficient of a plurality of coefficients and a corresponding state of a plurality of states encoded with block unary encoding;
identify at least one error state, of the plurality of states, having a string value that is not a block unary code string of a set of block unary code strings;
compute an updated measurement of superposition state based on the plurality of states without the at least one error state;
provide the updated measurement to a quantum information processing (QIP) system to perform at least a portion of a quantum operation.

8. The computer system of claim 7, wherein each block unary code string of the set of block unary code strings includes only one 1 or one 0.

9. The computer system of claim 8, wherein identifying the at least one error state comprises identifying more than one 1 or more than one 0 in the string value.

10. The computer system of claim 7, wherein each block unary code string of the set of block unary code strings includes a plurality bits each representing a quantum bit of a plurality quantum bits of the quantum computer.

11. The computer system of claim 7, wherein the quantum computer is a trapped ion quantum computer and the computer system is a classical computer.

12. The computer system of claim 7, wherein the processor is further configured to, in response to identifying the at least one error state, transmit a request to the quantum computer to rerun the measurement.

13. A non-transitory computer-readable medium storing code with instructions executable by a processor to:
receive a measurement, output by a quantum computer, of superposition state defined by a sum of a plurality of addends, wherein each addend of the plurality of addends is a product between a corresponding coefficient of a plurality of coefficients and a corresponding state of a plurality of states encoded with block unary encoding;
identify at least one error state, of the plurality of states, having a string value that is not a block unary code string of a set of block unary code strings;
compute an updated measurement of superposition state based on the plurality of states without the at least one error state; and
provide the updated measurement to a quantum information processing (QIP) system to perform at least a portion of a quantum operation.

14. The non-transitory computer-readable medium of claim 13, wherein each block unary code string of the set of block unary code strings includes only one 1 or one 0.

15. The non-transitory computer-readable medium of claim 14, wherein identifying the at least one error state comprises identifying more than one 1 or more than one 0 in the string value.

16. The non-transitory computer-readable medium of claim 13, wherein each block unary code string of the set of block unary code strings includes a plurality bits each representing a quantum bit of a plurality quantum bits of the quantum computer.

17. The non-transitory computer-readable medium of claim 13, wherein the quantum computer is a trapped ion quantum computer.

18. The non-transitory computer-readable medium of claim 13, further comprising instructions executable by the processor to, in response to identifying the at least one error state, transmit a request to the quantum computer to rerun the measurement.

* * * * *